United States Patent [19]

Dixon et al.

[11] 4,064,357

[45] Dec. 20, 1977

[54] INTERCONNECTED PRINTED CIRCUITS AND METHOD OF CONNECTING THEM

[75] Inventors: Herbert Dixon, West Andover, Mass.; Walter Heinrich, Derry; Gilbert Morris, Amherst, both of N.H.

[73] Assignee: Teledyne Electro-Mechanisms, Nashua, N.H.

[21] Appl. No.: 636,986

[22] Filed: Dec. 2, 1975

[51] Int. Cl.² ............................................. H05K 1/00
[52] U.S. Cl. .................................... 174/68.5; 29/625
[58] Field of Search ................... 174/68.5; 317/101 B, 317/101 C, 101 CM; 29/625, 626, 628, 627

[56] References Cited

U.S. PATENT DOCUMENTS

| | | | |
|---|---|---|---|
| 2,683,839 | 7/1954 | Beck | 174/68.5 |
| 2,889,393 | 6/1959 | Berger | 174/68.5 |
| 3,052,823 | 9/1962 | Anderson et al. | 174/68.5 X |
| 3,098,951 | 7/1963 | Ayer et al. | 174/68.5 X |
| 3,228,093 | 1/1966 | Bratton | 174/68.5 X |
| 3,315,133 | 4/1967 | Walker | 174/68.5 X |
| 3,557,446 | 1/1971 | Charschan | 174/68.5 X |
| 3,680,209 | 8/1972 | Hacke | 174/68.5 X |

*Primary Examiner*—Arthur T. Grimley

*Attorney, Agent, or Firm*—Brumbaugh, Graves, Donohue & Raymond

[57] ABSTRACT

A method of making and electrically interconnecting layers of printed circuitry involves the steps of: (1) coating an insulator on both sides with an adhesive; (2) punching holes through the insulator at points where interconnections are to be made; (3) laminating conductor planes to both sides of the insulator by means of the adhesive; (4) forming printed circuit patterns on the conductors such that a proper conductor geometry is created at the points where the interconnections are to be made; (5) applying pre-punched, adhesive-coated cover layers of insulation over the exposed printed circuits, except in the area of the interconnections; and (6) applying solder to the conductor pattern. Since the geometry at the interconnections is carefully controlled a solder bridge is formed, which connects the two conductor patterns during step (6) by the flow of solder into the interconnection area, past the upper conductor, to the lower conductor. Alternatively, solder can be deposited between the conductor planes at the interconnection points during the formation of the laminate. In such case the conductor geometry at the interconnection points can be arbitrary.

13 Claims, 9 Drawing Figures

INTERCONNECTED PRINTED CIRCUITS AND METHOD OF CONNECTING THEM

BACKGROUND OF THE INVENTION

This invention relates to printed circuits and, more particularly, to a method for interconnecting flexible printed circuits.

Generally, printed circuit layers are mechanically connected by fastening two circuits together in the proper relationship on a substrate by means of an adhesive. Electrical interconnections are then accomplished by various methods, such as by punching holes through both printed circuit boards and plating through these holes to connect the conductor layers of the two printed circuits. Besides plating through the holes, eyelets, tublelets, welding, brazing, etc. have been used in the holes to establish the interconnections. In still other processes, the connecting holes are filled with conductive material such as powdered metal (followed by sintering), metal paste or conducting paint. These processes are expensive and time consuming because, except in the plated-through hole process, each interconnection hole must be processed individually. Although the plated-through hole process is a mass production process which does not require that each interconnection be treated individually, it has disadvantages because the plated-through holes are subject to plating cracks when the boards are flexed, thereby producing intermittent connections.

Recent advances have led to the successful use of solder to interconnect printed circuits, thereby making use of the wave soldering step, which connects circuit components to the board. Such a process is described in U.S. Pat. No. 3,888,629 to Hastings et al., which is assigned to the assignee of the present invention. This process makes use of concentric holes of different diameter at each interconnection point in order to permit the solder to flow through the holes connecting the two circuits. With the concentric hole technique it is sometimes difficult to register all of the holes needed for a complex circuit. Also, this type of connection cannot be visually inspected.

SUMMARY OF THE INVENTION

The present invention is directed to overcoming the problem of making high quality connections between flexible printed circuits laminated to both sides of an insulator in mass interconnection processes, and the expense and time required in individual interconnection processes. In one embodiment this is accomplished by forming the printed circuit patterns in the area of the interconnections in such a way that the conductor pattern on the side to be soldered is significantly smaller than the interconnection hole through the insulator. As a result a solder bridge can be formed between the two conductor patterns during the manufacturing process by the flow of solder pass one conductor pattern to the other. Alternatively, solder can be placed at the interconnection points during the formation of the laminate, thereby eliminating the need for a special circuit pattern at the interconnection points.

In an illustrative embodiment of the invention two conductor layers are laminated to an insulating layer that has been coated with a suitable adhesive and pre-punched so that the potential interconnection areas are formed. The exposed conductor areas are then etched to form the desired circuit patterns. The conductor areas of the printed circuits at the interconnections are designed so that a solder filet connecting the patterns can be formed at the site of the pre-punched holes in the insulation from one or both sides of the laminate. Next, two pieces of adhesive coated insulation are registered over and laminated to the circuit. There must be pre-punched holes at least through one of these pieces of insulation at the interconnection areas. Both sides of the multilayer circuit are then solder coated, e.g. by wave soldering. The soldering step creates the interconnection because of a solder bridge that forms at the interconnection areas due to their design. If desired, a final overcoat of clear plastic film can be placed over one or both sides of the multilayer circuit.

In a second embodiment of the invention a conductor layer is laminated to a pre-punched insulating layer with an adhesive. Solder is then applied to the insulator side of the lamination and fills the pre-punched holes which will eventually establish the interconnection. Next, an adhesive film that has been pre-punched in the interconnection areas is used to laminate a second conductor onto the other side of the insulating layer. The conductor layers then have the desired printed circuit pattern etched on them. In this embodiment, however, the circuit pattern at the interconnection areas need not have any particular design. Following the etch step, additional pre-punched insulators are used to cover the circuit pattern, except at the interconnection areas, and the laminate is wave soldered. In this embodiment the solder filet is formed from the solder trapped between the conductor layers during the first solder operation and is not due to the flow of solder pass an especially designed circuit pattern.

Since the interconnections in both embodiments are made by solder bridges and an overcoat of clear plastic can be used, the interconnections can be visually inspected. Also, if external circuit components are to be attached to the circuits, holes can be punched or drilled at the appropriate locations and the components soldered into place. The soldering of the components, however, will not affect the interconnections. Hence, the manufacturer can complete the circuit production phase on a mass production basis, but the user can install the components at a later time. Thus, the manufacturer maintains control over the quality of the interconnections.

BRIEF DESCRIPTION OF THE DRAWINGS

The foregoing and other features of the present invention will be more readily apparent from the following detailed description and drawings in which.

DESCRIPTION OF EXEMPLARY EMBODIMENTS

Figure 1:
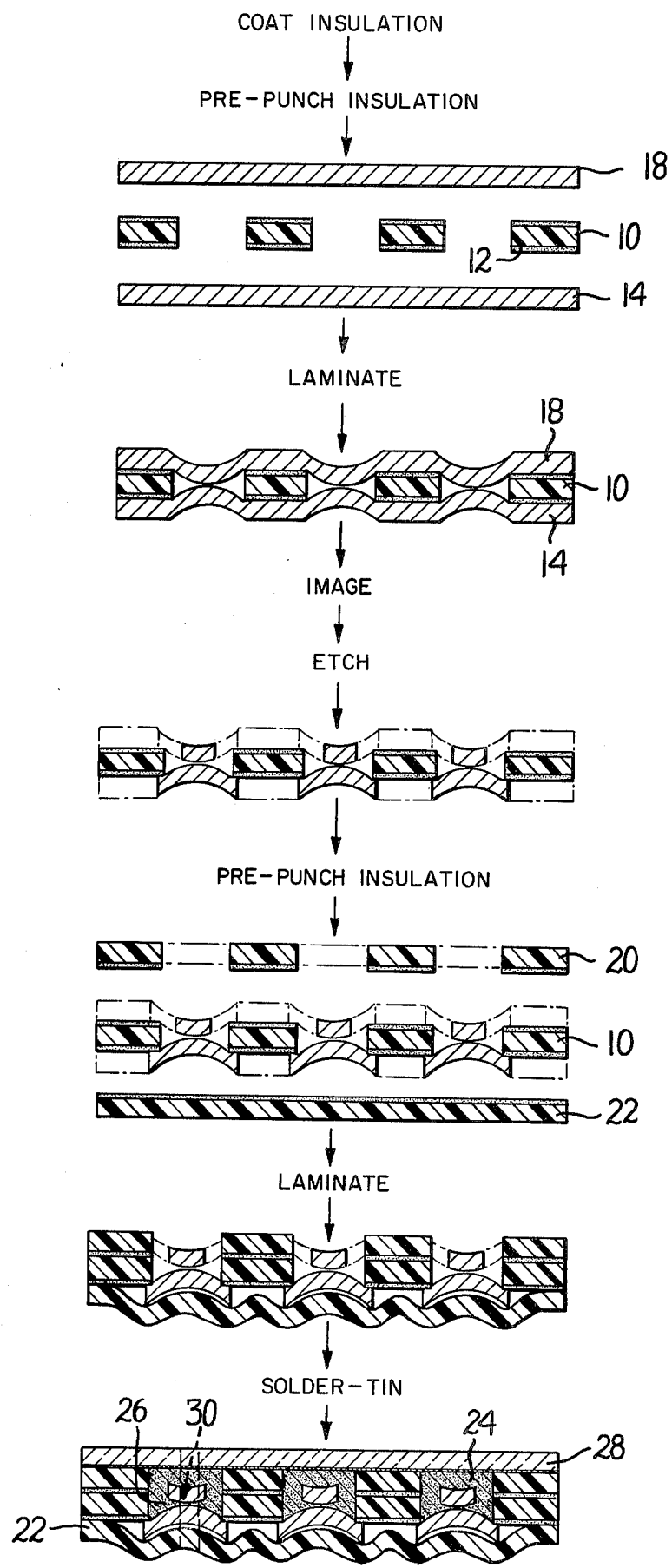
FIG. 1 is a flow chart of the steps of an illustrative embodiment of the process of the present invention.

In FIG. 1 the steps of the process of the present invention are illustrated, but the drawing is not to scale and the thicknesses of the layers have been exaggerated for the sake of clarity.

The first steps of the process involves the creation of a flexible sheet of insulation 10 with holes pre-punched in it at the sites where the interconnections are to be made. This insulating layer also has adhesive 12, such as DuPont Pyralux ® WA, applied to both sides. It is important to use an adhesive such as DuPont WA which will not flow onto the interconnection pads to be formed. Next, two conductor layers 14 and 18, such as flexible copper sheets, are laminated onto the insulator under pressure. The pressure during the lamination process causes the conductor layers to bow inward as shown.

Printed circuit patterns, registered with respect to the interconnection areas established by the pre-punched insulation, are then created on both of the conductor layers. Any convenient process can be used to accomplish this. In particular, the conductor sheets can be coated with a photoresist. Then, photographic transparancies can be used to image the printed circuit designs onto the resist-covered conductors. The exposed areas of the photoresist are then removed and the conductors are subjected to an acid etch that removes the conductor from the unwanted areas. Alternatively, an acid resist can be screened onto the conductors to form the circuit patterns. Regardless of the method used both conductors can be etched simultaneously or they can be etched sequentially. When they are done sequentially, the etch can be in the form of a spray directed upwardly onto a conductor layer held over a spray nozzle. The etch is slow and can be accurately controlled so as to cut only in the direction of the spray and only to the desired depth. After the etching step the remainder of the photoresist is removed. This will leave the printed circuit patterns on the conductor layers.

At those locations where interconnections are desired between the two circuit patterns, the printed circuits are designed so that the pattern on the side to which the interconnection solder is to be supplied will be significantly smaller than the interconnection hole through the insulating layer. This can be seen from FIGS. 2 and 3, which are top and section views of such an interconnection area. Here the top conductor 18 is much narrower than the interconnection hole. The particular shape involved is not critical as long as there is enough room for the solder to flow pass one conductor to the other and for ventilation, so that gases can escape from the area. Examples of typical acceptable patterns are shown in FIGS. 5A-5D. If there is not enough ventilation, bubbles will form in the solder and a poor connection will result.

Returning again to FIG. 1 after the circuit patterns have been formed on the conductors, a pre-punched adhesive coated insulator 20 and an unpuched adhesive coated insulator 22 are applied over the conductor layers 18 and 14, respectively. The holes in the insulator 20 are at the interconnection points and at pads for the connection of external components. If access to circuit pattern 14 is necessary, holes can also be punched in insulating layer 22. This step could also be eliminated, thereby causing the tining of all of the conductor areas during the soldering step, which is the next step of the process. In the soldering step the laminate is soldered, e.g. by passing it through a solder wave, immersing it in a solder solution or passing it under a solder tiner roller. When this occurs the solder 24 flows past the narrow conductor pattern on layer 18 to the pattern on layer 14, thus forcing the air from that area and forming an interconnecting solder filet. The solder may flow into the area 26 between the two conductors, but this is not necessary for a good connection.

As a final step, the laminate can be coated on one or both sides by a clear plastic overcoat 28, such as Kapton, FEP Teflon or Mylar. This will allow for visual inspection of the interconnection. Also, because one of the design of the circuit patterns at the interconnection it is possible to tell by such a visual inspection if a good solder connection has been made.

Besides having separate pads for the connection of external components it is also possible to use the interconnection areas for this purpose. In such a case a hole 30 would be drilled through the center of the interconnection area. However, since the interconnection of the two circuits has already been made, their quality is assured by the manufacture of the circuit board. After the external components are installed, the circuit can again be wave solder to connect them without affecting the interconnections.

Figure 2:
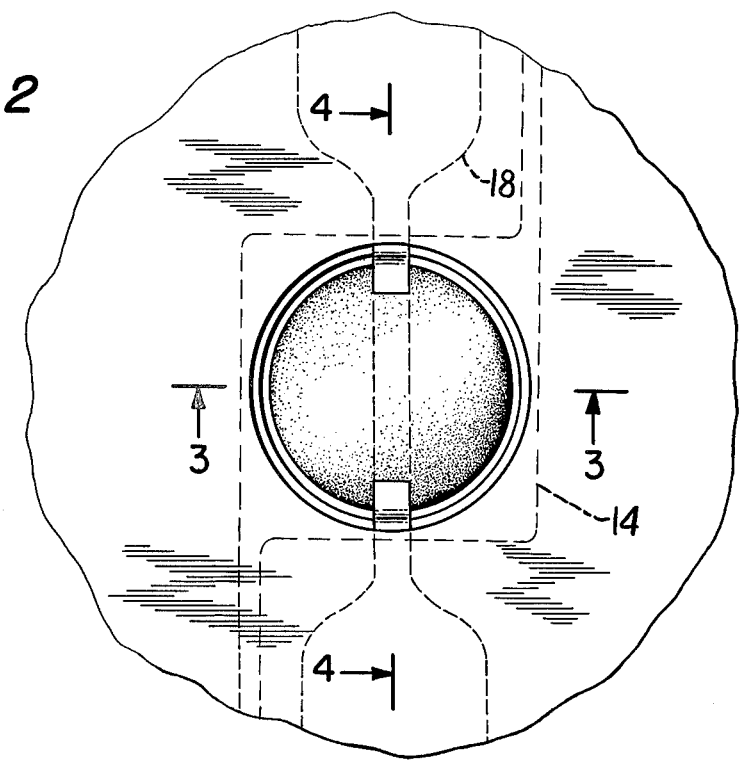
FIG. 2 is a top view of a solder bridge formed at an interconnection point according to the present invention.
Figure 3:
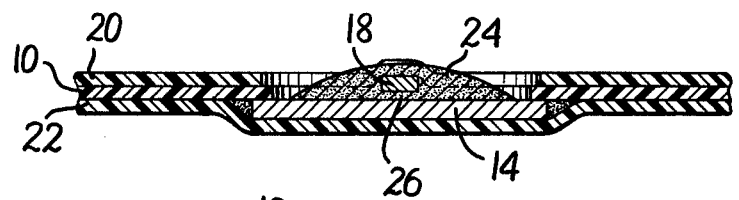
FIG. 3 is a cross-section through the solder bridge of FIG. 2 along line 3—3.

FIG. 3 shows a cross-section through the interconnection area of FIG. 2 along line 3—3. This interconnection area was produced by the process of the present invention shown in FIG. 1. The interconnection area in FIG. 2 does not have an overcoat or a component hole, but these could be provided if necessary. In addition, no access holes were cut in insulator 22 at the interconnection area of FIG. 2. This could be true for all of insulator 22 or just in certain preselected areas. From FIG. 3 it can be seen that the solder 24 has formed a bridge connecting the narrow conductor 18 and conductor 14. In the areas where there is no conductor, the insulators (10, 20 and 22) are in contact with each other.

Figure 4:
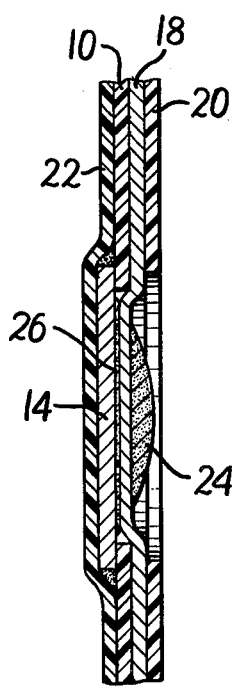
FIG. 4 is a cross-section through the solder bridge of FIG. 2 along line 4—4.
Figure 5A:
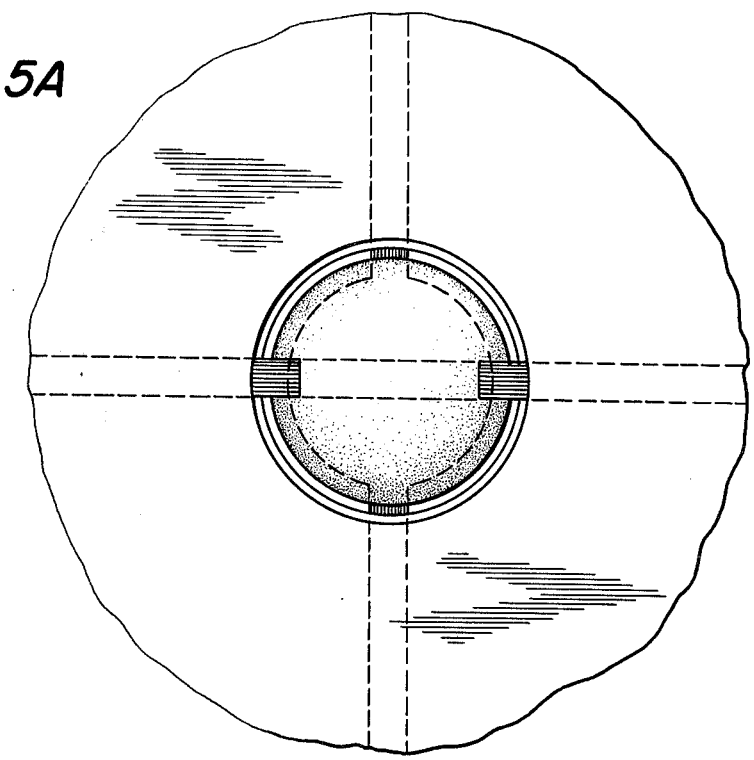
FIGS. 5A-5D are examples of appropriate circuit patterns for the interconnection areas required with the process of FIG. 1.
Figure 5B:
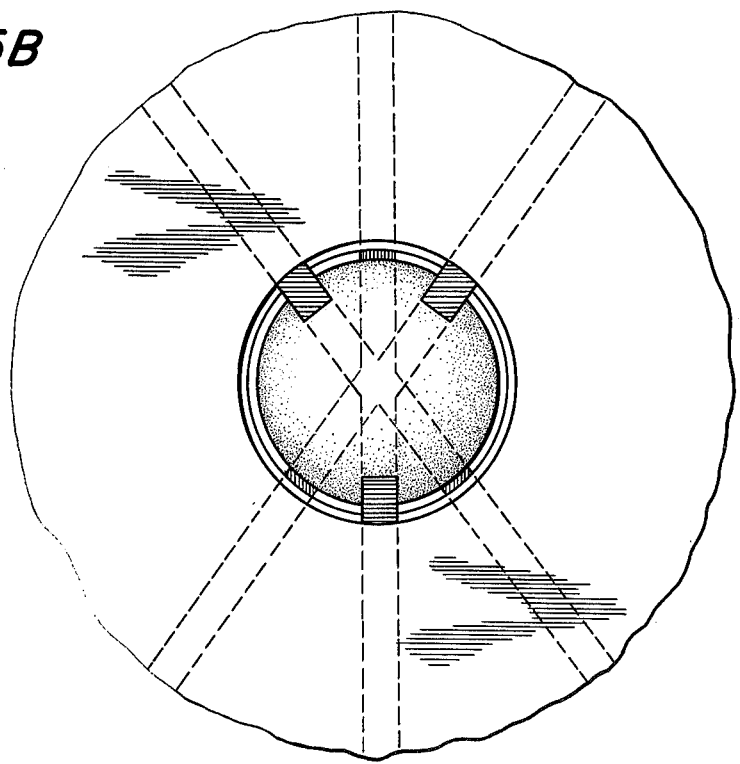
Figure 5C:
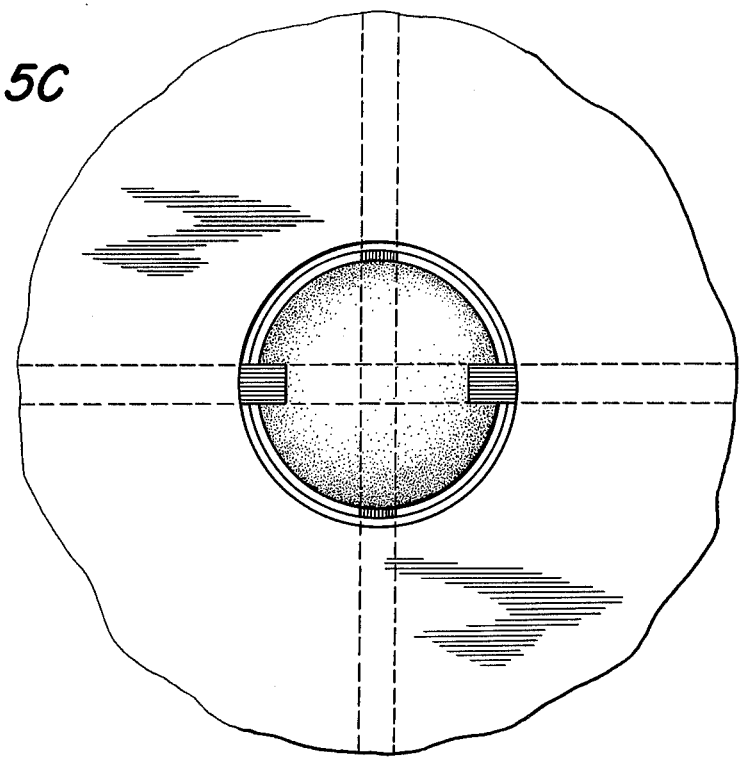
Figure 5D:
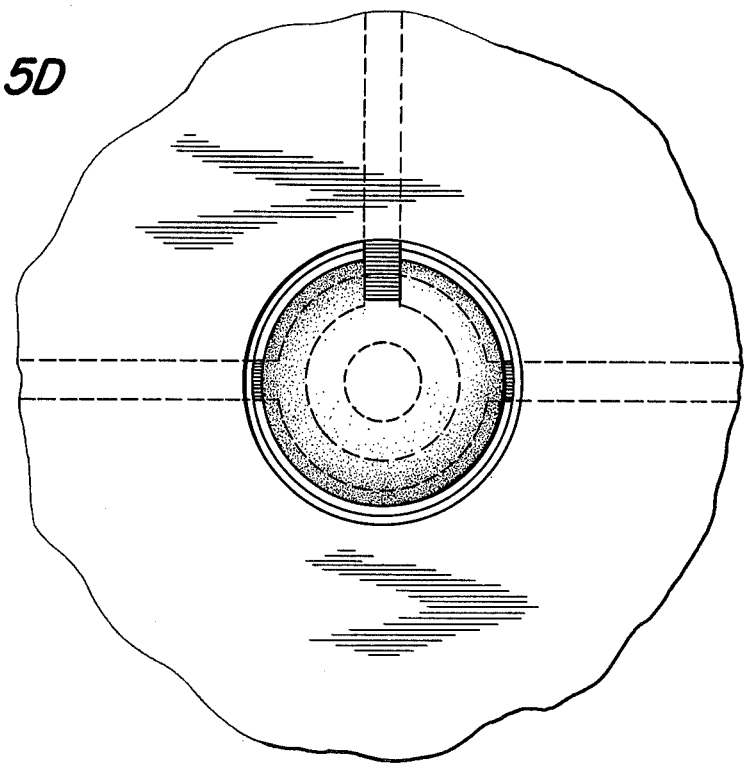

FIG. 4 shows a cross-section through FIG. 2 along line 4—4. Here it can be seen that conductor 18 separates the insulators 10 and 20 and the conductor 14 partially separates the insulators 10 and 22.

As a variation on the printed circuits described, the component terminals can be located on one side and the interconnections on the other. The same is true for locating components on both sides of the circuit board. Also, the process can be used to connect two individual discrete circuits after they have been etched on separate substrates. In such a process a hole is milled with a skieving rod through the substrate of one of the circuits down to the copper. Then the copper sides of the two patterns are laminated to a pre-punched adhesive coated insulating layer. Finally solder is flowed over the laminate. This technique is possible whenever the printed circuits have the proper design at the desired interconnection points. Alternatively, the circuit with the milled hole can be subjected to a preliminary solder step according to the embodiment of the invention shown in FIG. 6.

Figure 6:
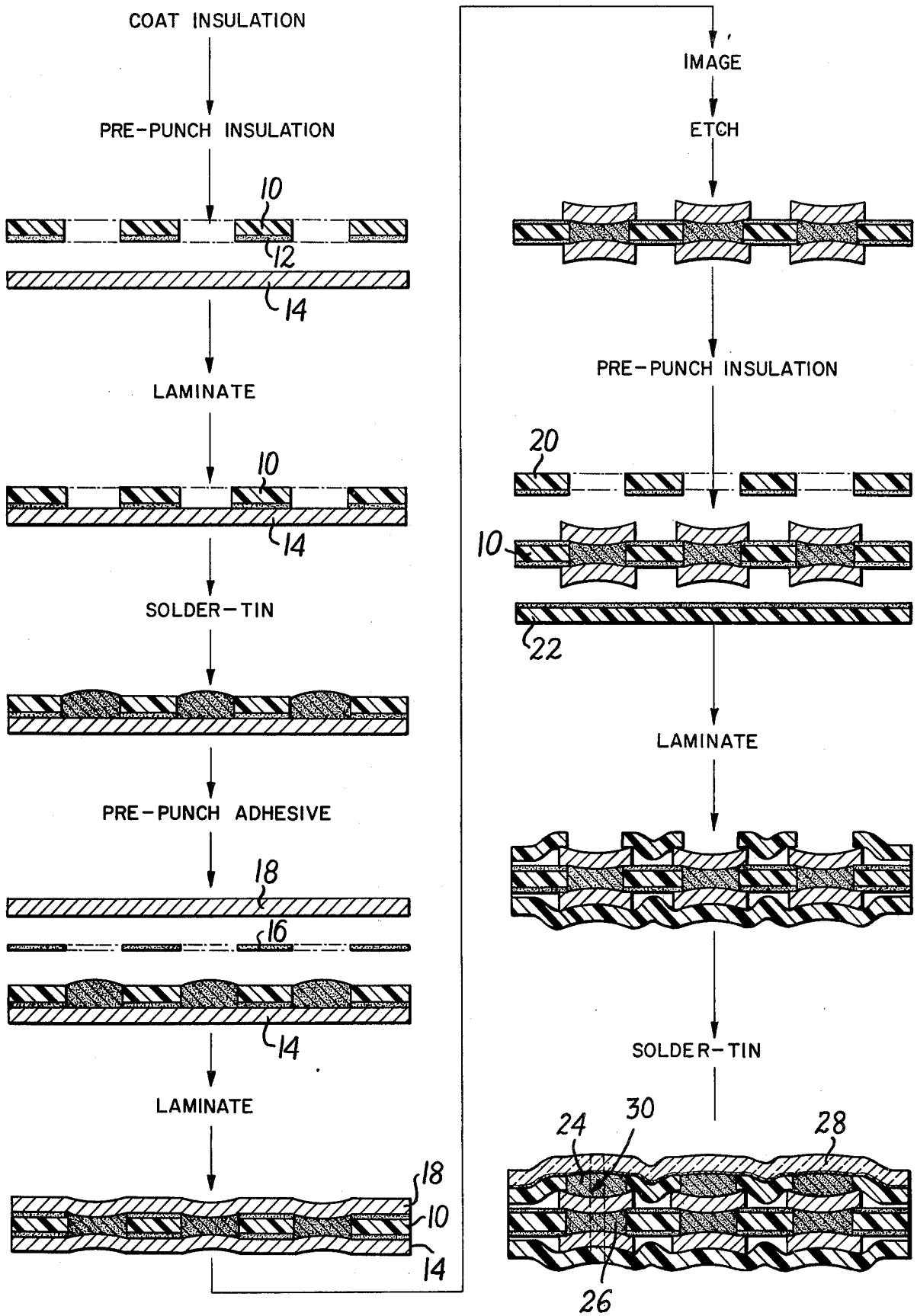
FIG. 6 is a flow chart illustrating the steps of a modified embodiment of the process of the present invention.

In FIG. 6 similar parts are marked with the same reference number. During the first step of the process of FIG. 6 a flexible insulation sheet 10 is coated with the dry adhesive 12. The insulation then has holes punched in it at the points where interconnections are to be made. Next, the pre-punched insulation is laminated onto the conductor and the laminate is covered with solder for the first time. A pre-punched flexible adhesive film 16, with its holes corresponding to the interconnection pattern, is then used to attach the second flexible conductor 18 to the insulator, thus creating a laminate consisting of two flexible conductor sheets (14 and 18) attached to either side of the insulator sheet 10 and with solder filling the interconnection holes. From this point on, the process is the same as that shown in FIG. 1, except that it is unnecessary to have any particular design for the printed circuit pattern at the interconnection points.

While the invention has been particularly shown and described with reference to preferred embodiments thereof, it will be understood by those skilled in the art that various changes in form and details may be made therein without departing from the spirit and scope of the invention. In particular, more than two circuits can be joined by this process if it is extended. This would require one more adhesive layer and one more soldering step for each additional circuit. Thus, the number of additional circuits that can be connected depends on the resistance of the adhesive to heating during the extra solder steps.

We claim:

1. A multilayer printed circuit board having at least two conductor layers separated by an insulator layer, said conductor layers being in the form of printed circuit patterns and the circuit patterns on different conductor layers being in electrical communications with each other by means of interconnection points, characterized in that:

the insulator at the interconnection point defines a hole passing between the interconnected conductor layers at the interconnection point, the hole in the insulator being filled with solder that contacts both conductor layers; and the printed circuit pattern for one conductor layer at the interconnection points is significantly smaller than the interconnection hole so that solder can flow past it into the hole during manufacture.

2. A printed circuit board as claimed in claim 1, wherein the conductor layers and insulator layers are flexible, thereby creating a flexible printed circuit.

3. A printed circuit as claimed in claim 1, wherein the areas of the conductor layers without an interconnection circuit pattern are covered with additional insulator layers.

4. A printed circuit as claimed in claim 1, wherein at least one side of the flexible circuit board has an overcoat sheet applied to it.

5. A printed circuit as claimed in claim 3, wherein the overcoat sheet is a clear plastic.

6. A method of making electrically interconnected printed circuitry layers, comprising the steps of:

forming a laminate of a first adhesive coated insulating sheet, with holes pre-punched in it, sandwiched between first and second conductor layers;

creating printed circuitry patterns on the conductor layers with the interconnecting points corresponding to the pre-punched holes in said insulating sheet, said printing circuitry patterns being especially designed so that the pattern at the interconnecting points, at least one of the conductor layers, is significantly smaller in diameter than the pre-punched hole in the insulating sheet so that solder can flow past that pattern to the other conductor layer; and applying solder to at least the especially designed conductor layer in order to form electrically interconnected circuitry.

7. The method of claim 6 further including the step of laminating adhesive-coated second and third insulating sheets to the exposed first and second conductor layers, respectively, after the printed circuit pattern has been formed, at least one of said second and third insulating sheets having pre-punched holes at least at the positions of the interconnection points.

8. The method of claim 6, further including the step of laminating an overcoat sheet to at least one side of the connected circuitry after the soldering step.

9. The method of claim 8, wherein the overcoat sheet is a clear plastic.

10. The method of claim 6, further including the step of forming a hole for an external component through the interconnection point after the soldering step.

11. The method of claim 6, wherein the step of creating a printed circuitry pattern comprises the steps of applying a photoresist to the conductor layers, imaging the desired circuitry patterns onto the photoresist, removing the photoresist from the imaged areas and etching the conductor areas not covered by photoresist.

12. The method of claim 11, wherein the etch is an acid etch applied in the form of a spray.

13. The method of claim 6, wherein the step of applying the solder if performed by passing the circuits through a solder wave.

* * * * *

UNITED STATES PATENT AND TRADEMARK OFFICE
CERTIFICATE OF CORRECTION

PATENT NO. : 4,064,357
DATED : December 20, 1977
INVENTOR(S) : Dixon et al.

It is certified that error appears in the above-identified patent and that said Letters Patent are hereby corrected as shown below:

Column 1, line 16 & 17, "tublelets" should read -- tubelets --;

Column 1, line 35, "3,888,629" should read -- 3,888,639 --;

Column 1, line 58, "pass" should read -- past --.

Column 2, line 34, "pass" should read -- past --.

Column 3, line 8, "involves" should read -- involve --;

Column 3, lines 25-26, "transparancies" should read -- transparencies --;

Column 3, line 36, "The" should read -- This --;

Column 3, line 52, "pass" should read -- past --;

Column 3, line 60, "unpuched" should read -- unpunched --.

Column 4, line 13, delete "one";

Column 4, line 25, "solder" should read -- soldered --.

UNITED STATES PATENT AND TRADEMARK OFFICE
CERTIFICATE OF CORRECTION

PATENT NO. : 4,064,357

DATED : December 20, 1977

INVENTOR(S) : Dixon et al.

It is certified that error appears in the above-identified patent and that said Letters Patent are hereby corrected as shown below:

Column 6, line 16, after "least" insert -- on --;

Column 6, line 48, "if" should read -- is --.

Signed and Sealed this

Twenty-fourth Day of October 1978

[SEAL]

Attest:

RUTH C. MASON
*Attesting Officer*

DONALD W. BANNER
*Commissioner of Patents and Trademarks*